(12) United States Patent
Husband et al.

(10) Patent No.: US 8,848,323 B2
(45) Date of Patent: Sep. 30, 2014

(54) SUPERCONDUCTING FAULT CURRENT LIMITER

(75) Inventors: Stephen M. Husband, Derby (GB); Alexander C. Smith, Holmfirth (GB)

(73) Assignee: Rolls-Royce plc, London (GB)

( * ) Notice: Subject to any disclaimer, the term of this patent is extended or adjusted under 35 U.S.C. 154(b) by 824 days.

(21) Appl. No.: 12/934,746

(22) PCT Filed: Mar. 5, 2009

(86) PCT No.: PCT/GB2009/000599
§ 371 (c)(1),
(2), (4) Date: Sep. 27, 2010

(87) PCT Pub. No.: WO2009/122124
PCT Pub. Date: Oct. 8, 2009

(65) Prior Publication Data
US 2011/0026170 A1    Feb. 3, 2011

(30) Foreign Application Priority Data

Apr. 4, 2008    (GB) .................................... 0806090.7

(51) Int. Cl.
*H02H 9/02* (2006.01)
*H01L 39/16* (2006.01)

(52) U.S. Cl.
CPC ...................................... *H01L 39/16* (2013.01)
USPC .......................................................... 361/19

(58) Field of Classification Search
CPC ........ H02H 7/001; H02H 9/023; Y02E 40/68; Y02E 40/69; Y02E 40/644; H01F 6/02; H01F 6/06
USPC .......................................................... 361/19
See application file for complete search history.

(56) References Cited

U.S. PATENT DOCUMENTS

| 4,254,299 | A | * | 3/1981 | Horvath et al. | 174/15.5 |
| 5,057,489 | A | * | 10/1991 | Ohkawa et al. | 505/231 |
| 5,761,017 | A | * | 6/1998 | Hodge et al. | 361/19 |

(Continued)

FOREIGN PATENT DOCUMENTS

| EP | 1 622 208 A1 | 2/2006 |
| JP | A-01-157226 | 6/1989 |

OTHER PUBLICATIONS

Nardelli et al., "Test Results on $_{MgB2}$ Windings for AC Applications," *IEEE Transactions on Applied Superconductivity*, vol. 17, No. 2, Jun. 1, 2007, pp. 2742-2745.

Ye et al., "Experimental studies of the quench behaviour of MgB2 superconducting wires for fault current limiter applications," *Superconducting Science and Technology*, vol. 20, No. 7, Jul. 1, 2007, pp. 621-628.

(Continued)

*Primary Examiner* — Jared Fureman
*Assistant Examiner* — Nicholas Ieva
(74) *Attorney, Agent, or Firm* — Oliff PLC

(57) ABSTRACT

A superconducting fault current limiter comprises a superconducting element having a plurality of superconducting portions and at least one connector. Each superconducting portion has end regions and each connector is connected to the end regions of adjacent superconducting portions to electrically and thermally connect adjacent superconducting portions of the superconducting fault current limiter together. Each connector provides a local reduction in the critical current and quench current of the end regions of the superconducting portions in contact with the at least one connector. This provides a phased transition of the superconducting fault current limiter in relation to the severity of a fault current.

27 Claims, 3 Drawing Sheets

(56) References Cited

U.S. PATENT DOCUMENTS

2001/0052814 A1* 12/2001 Takita ............................. 330/10
2006/0122067 A1*  6/2006 Holcomb ...................... 505/124
2007/0157450 A1*  7/2007 Takahashi et al. .............. 29/458

OTHER PUBLICATIONS

International Search Report issued in Application No. PCT/GB2009/000599; Dated Jul. 9, 2009.

* cited by examiner

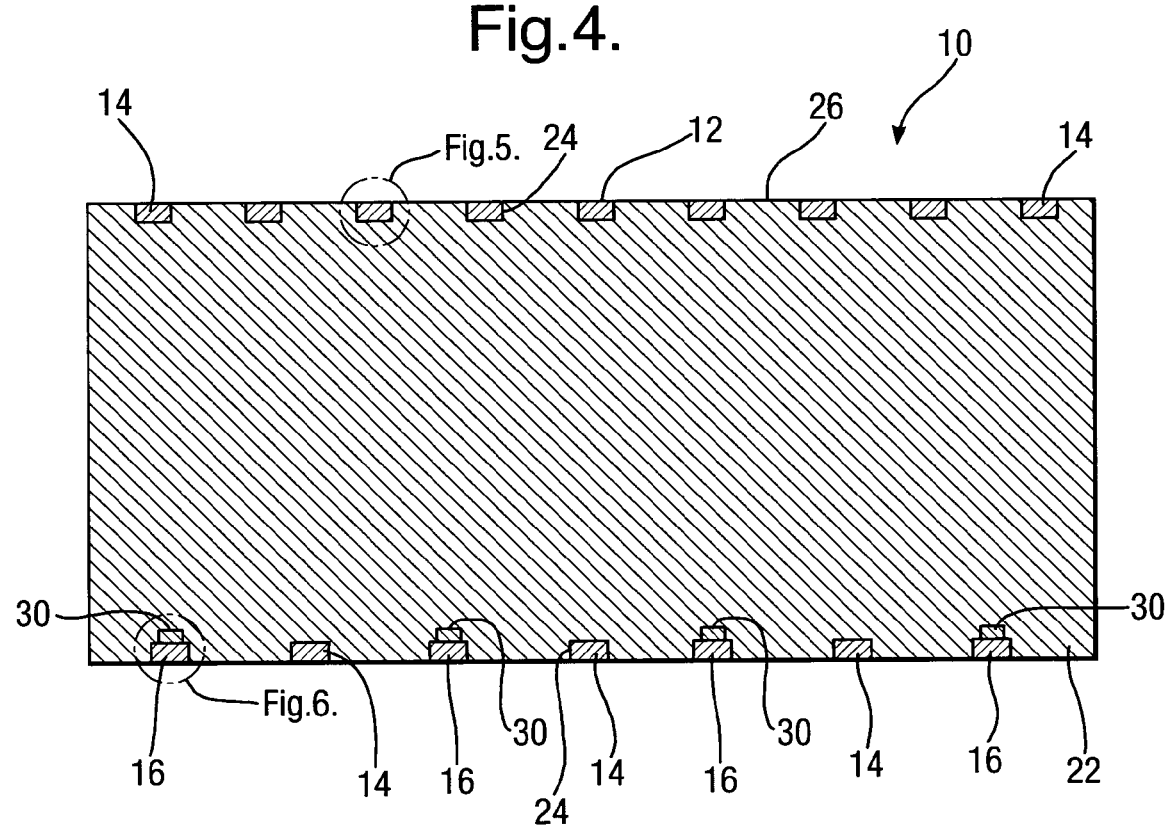
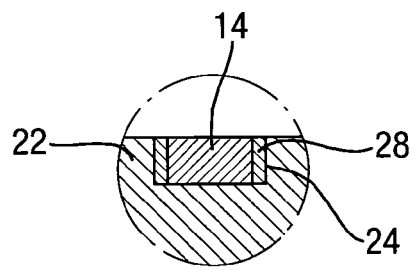
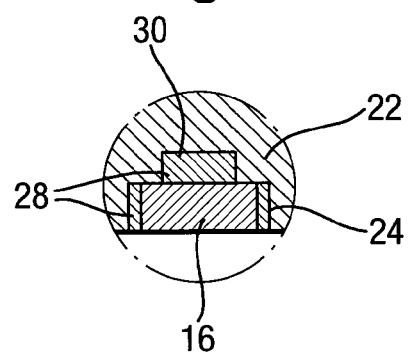

SUPERCONDUCTING FAULT CURRENT LIMITER

The present invention relates to a superconducting fault current limiter.

Superconductors are superconducting, exhibits no DC electrical resistance, when operated below their critical temperature, critical current and critical magnetic field, e.g. when in their superconducting state. A superconductor quenches from its superconducting state to its normal state, exhibits DC electrical resistance, if any one of the critical temperature, critical current or critical magnetic field is exceeded.

Typically a resistive superconducting fault current limiter is designed so that upon the occurrence of a fault, a fault current exceeds the critical current and the superconductor quenches from its superconducting state to its normal state and provides an impedance in the electrical circuit. This impedance provided by the quenched superconductor results in ohmic losses ($I^2R$) within the superconducting fault current limiter leading potentially to high temperatures. The design of a superconducting fault current limiter is significantly influenced by the thermal design to tolerate the heat due to the resultant ohmic losses.

Most superconductors, and especially ceramic based high temperature superconductors, require a completely uniform quench from the superconducting state to the normal state. A uniform quench from the superconducting state to the normal state is required to prevent very high local temperature rises, due to the ohmic losses, which may result in local burn out of the superconductor. The uniform quenching of the superconductor is achieved by the use of a thermally and electrically conductive material around the superconductor. The conductive material stabilises the superconductor and enables a relatively smooth change in resistance during the quenching process. Some designs of superconductor also utilise the higher fault current level to increase the local magnetic field, self triggering device, to assist the quenching process and help overcome any stability problems of the superconductor.

There are considerable advantages if a superconductor, such as magnesium diboride, does not require any stabilisation. During the quenching process it is sometimes preferred to provide a smooth quench transition. A smooth quench transition reduces voltage transients and the effects of stored energy within the electrical circuit and the superconducting fault current limiter.

EP1622208A1 discloses that ceramic based superconductors are provided with shunt material, or stabiliser material, to provide a uniform quench along the whole of the superconductor and also to provide a smooth transition.

Magnesium diboride superconductors do not require such stabilisers and has better thermal shock performance. The use of magnesium diboride superconductors allows a more rapid quench from the superconducting state to the normal state than any other commonly available ceramic based superconductor. Under normal operating conditions a magnesium diboride superconducting fault current limiter is allowed to quench at its own rate. For "worst case" fault conditions a rapid transition from the superconducting state to the normal state is ideal and ensures the performance required. For "non worse case" fault conditions, i.e. apparent non-zero impedance faults, a smoother transition from superconducting state to normal state is more desirable to reduce any voltage surge implications and to provide a more consistent quench response to any fault scenario.

Accordingly the present invention seeks to provide a novel superconducting fault current limiter, which, reduces, preferably overcomes the above mentioned problem.

Accordingly the present invention provides a superconducting fault current limiter comprising a superconducting element and means to produce a local increase of temperature of the superconducting element to provide a local reduction in the critical current and quench current of the superconducting element.

Preferably the superconducting element having a plurality of superconducting portions and at least one connector, each superconducting portion having end regions, each connector being connected to the end regions of adjacent superconducting portions to electrically and thermally connect adjacent superconducting portions of the superconducting fault current limiter together such that each connector provides a local reduction in the critical current and quench current of the end regions of the superconducting portions in contact with the at least one connector.

Preferably the at least one connector comprises a metal, more preferably the at least one connector comprises copper.

Preferably the superconducting portions comprise magnesium diboride.

Preferably the superconducting portions and the at least one connector are arranged around a former.

Preferably the superconducting portions and the at least one connector are wound in a coil around the former.

Preferably the ends of the superconducting fault current limiter are connected to an electrical circuit by end connectors. Preferably the end connectors comprise copper. Preferably the end connectors are arranged in contact with a cooler.

Preferably the at least one connector is not arranged in contact with a cooler.

Preferably there is a plurality of connectors.

Alternatively the means to produce a local increase of temperature of the superconducting element comprising a first epoxy resin with a first predetermined thermal conductivity positioned at one or more positions in a groove on a former, a second epoxy resin with a second predetermined thermal conductivity positioned in the remainder of the groove and the first epoxy resin having a lower thermal conductivity than the second epoxy resin, the superconducting element being located in the groove in the former by the epoxy resin.

Alternatively the means to produce a local increase of temperature of the superconducting element comprising at least one region with a local increases in the depth of a groove in a former, the at least one region being arranged at one or more positions in the groove of the former, the superconducting element being located in the groove in the former by the epoxy resin, the former having a greater thermal conductivity than the epoxy resin.

Alternatively the means to produce a local increase of temperature of the superconducting element comprises an additional high magnetic permeability cylindrical sleeve around a portion of the superconducting element to increase the local magnetic field.

The present invention will be more fully described by way of example with reference to the accompanying drawings in which:

FIG. 4 is a longitudinal cross-section view through the superconducting fault current limiter shown in FIG. 2.

FIGS. 5 and 6 are enlargements of portions of FIG. 4.

The present invention is intended to provide a superconducting fault current limiter with a smoother quench transition using a non-stabilised superconducting element. The present invention provides a superconducting element comprising a plurality of superconducting portions which quench at slightly different rates, especially during "non worst case" fault current conditions.

Figure 1:
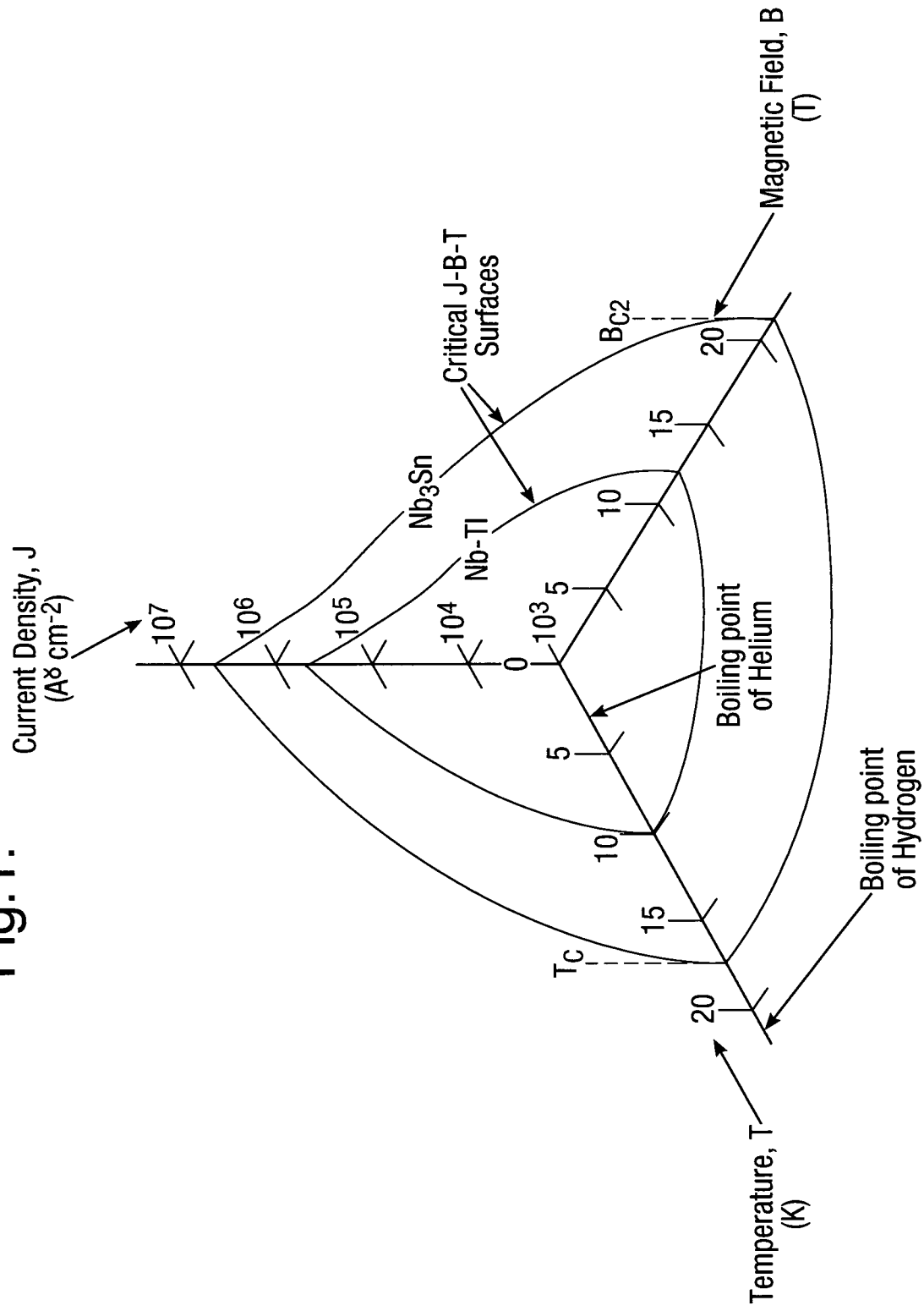
FIG. 1 is a graph showing superconducting characteristics.
Figure 2:
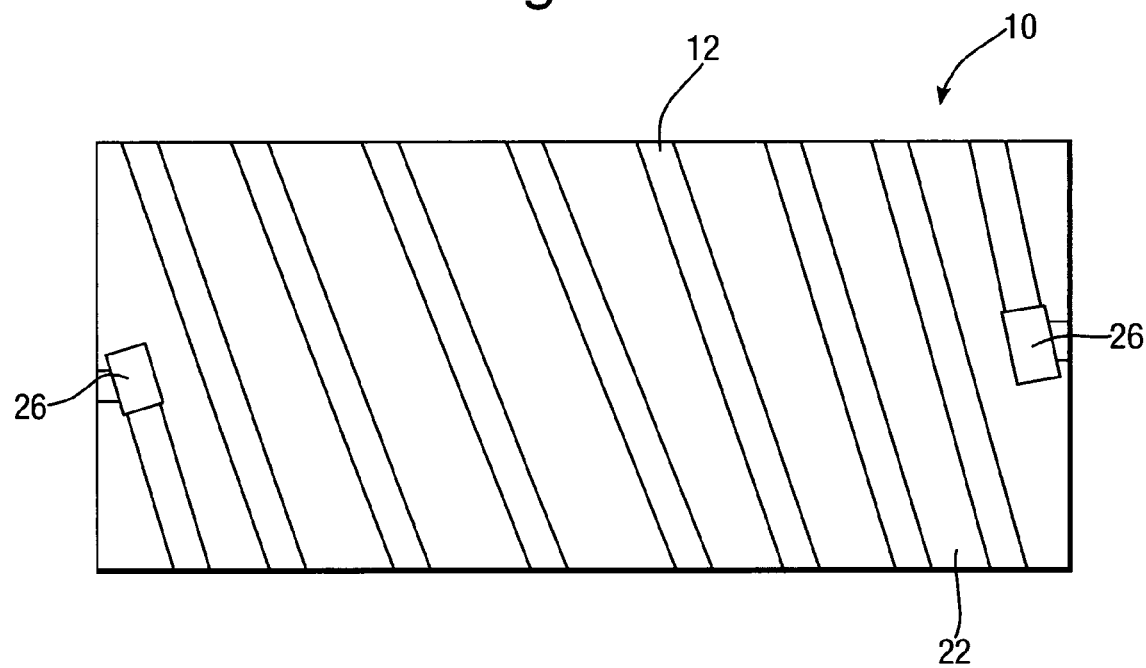
FIG. 2 shows a view of a superconducting fault current limiter according to the present invention from above.
Figure 3:
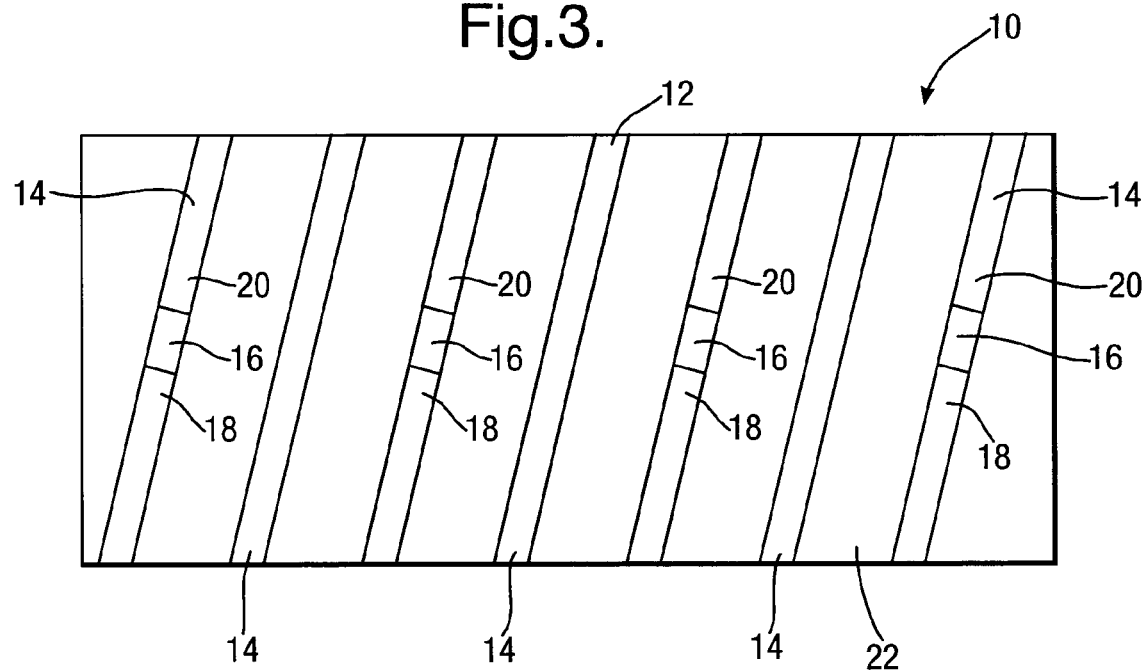
FIG. 3 shows a view of the superconducting fault current limiter shown in FIG. 2 from below.

As mentioned previously, the quench transition of a superconductor from a superconducting state to a normal state is dependent upon the local magnetic field, the local current and the local temperature, see FIG. 1. The quench transition is also dependent upon the local critical current characteristic, this characteristic may be due to local superconductor manufacturing tolerances or due to mechanical variations, for example a superconductor wire in compression has a slightly higher critical current than a superconductor wire in tension.

A superconducting fault current limiter 10 according to the present invention, as shown in FIGS. 2, 3, 4, 5 and 6, comprises a superconducting element 12, which has a plurality of superconducting portions 14 and at least one connector 16. Each superconducting portion 14 has end regions 18, 20. Each connector 16 is connected to the end regions 18, 20 of adjacent superconducting portions 14 to electrically and thermally connect adjacent superconducting portions 14 of the superconducting element 12 of the superconducting fault current limiter 10 together. In use each connector 16 provides a local reduction in the critical current and quench current of the end regions 18, 20 of the superconducting portions 14 in contact with the at least one connector 16.

The at least one connector 14 may comprise a metal, for example the at least one connector 16 comprises copper. The superconducting portions 14 may comprise magnesium diboride. The superconducting portions 14 are preferably superconducting wires which are circular in cross-section, but may be superconducting tapes which are rectangular in cross-section.

The superconducting portions 14 and the at least one connector 16 of the superconducting element 12 are arranged around a former 22. The former 22 may be cylindrical. The superconducting portions 14 and the at least one connector 16 of the superconducting element 12 are wound in a coil around the former 22. The superconducting element 12 is actually placed within a groove 24 machined within the periphery 26 of the former 22 and the groove 24 is filled with an epoxy resin 28 to hold the superconducting element 12 within the groove 24.

The ends of the superconducting fault current limiter 10 are connected to an electrical circuit by end connectors 26. The end connectors may comprise a metal, for example the end connectors comprise copper. The end connectors 26 are arranged in contact with a cooler 28. However, the at least one connector 16 is not arranged in contact with the cooler 28.

It is contemplated that the superconducting element 12 will comprise a plurality of superconducting portions 14 and a plurality of connectors 16.

In operation the at least one connector 16 exhibits a finite, though low, resistance to the flow of current through the superconducting element 12. Correspondingly an ohmic loss, $I^2R$ loss, is generated in the at least one connector 16 and the regions 18, 20 of the superconducting portions 14 leading to a slight local increase in temperature and thus a local reduction in the critical and quench current of the regions 18, 20 of the superconductor portions 14 in contact with the at least one connector 16. This local temperature rise ensures that the regions 18, 20 of the superconducting portions 14 of the superconducting element 12 will quench first providing an initial check on the rate of rise of a fault current. Where the rate of rise of the fault current is sufficiently reduced the heat will dissipate axially, longitudinally, along the remainder of the superconducting element 12 leading to a smooth thermally induced quench. Where the rate of rise of the fault current remains high the quench process will be activated along the whole length of the superconducting element 12 by a current induced quench. Importantly the connectors 16 also act as heat spreaders and help to minimise the rate of temperature rise of the regions 18, 20 of the superconducting portions 14 of the superconducting element 12 in contact with the connector 16. For long lengths of superconducting element 12 the connectors 16 are provided at predetermined intervals, distances, along the length of the superconducting element 12.

In a particular example the end connectors 26 are arranged at the top of the cylindrical former 22. and the axis of the former 22 is arranged horizontally. The end connectors 26 are thermally clamped to the cooler 28 to ensure the end connectors 26 are substantially at the same temperature or at a lower temperature than the remainder of the former 22 and superconducting element 12. The at least one connector 16 is provided at the bottom of the cylindrical former 22 and the at least one connector 16 is not directly thermally clamped to the cooler. It may be possible to provide a thermal barrier between the end connectors 26 and the cooler to provide a slight local temperature rise.

It is clear that for a "worst case" fault current the superconducting fault current limiter of the present invention still ensures a rapid and more uniform quench transition, as the quench current values will be rapidly exceeded along the whole length of the superconducting element. For "non worst case" fault currents the superconducting fault current limiter will check the fault current by a phased quench of the superconducting fault current limiter and this reduces the rate of rise of the fault current and thus leads to a smoother quench transition.

The advantages of the present invention are that there is a phased transition in relation to the severity, magnitude, of a fault current. There is a rapid transition for a "worst case" fault current. There is a reduced overall circuit impact for "non worst case" fault currents. The present invention is easy to implement. The present invention provides local heat spreading and the use of superconducting portions allows shorter lengths of superconducting material to be used in the superconducting element.

In another embodiment of the present invention it may be possible to provide an additional high magnetic permeability cylindrical sleeve around a portion of the superconducting element to increase the local magnetic field. This increase in the local magnetic field produces a local temperature rise and hence a local increase in temperature of the superconducting element. This has the advantage in that it does not need to be in contact with the former and the superconducting element, but has the disadvantage of being less efficient. The superconducting element may comprise a plurality of superconducting portions and one or more connectors or may comprise a single superconducting portion. In the case of a plurality of superconducting portions, the high magnetic permeability cylindrical sleeve is arranged around a portion of the former and the at least one connector to increase the local magnetic field.

It may be possible to arrange the end windings of the coil of the superconducting element to increase the local magnetic field due to end effects.

In another embodiment of the present invention, as shown in FIGS. 4 and 6 it may be possible to provide an additional thermally resistive sleeve for AC operation where very small AC losses are present, to increase the temperature locally. In this example the former 22 is provided with at least one region 30 with a local increases in the depth of the groove 24, in which the superconducting element 12 is placed. The at least one region 30 is arranged at one or more circumferential positions in the groove 24 of the former 22. The superconducting element 12 is again held in the groove 24 in the former 22 by the epoxy resin 28. The former 22 has a greater thermal conductivity than the epoxy resin 28 used to fill the groove 24 in the. former 22. Thus, the epoxy resin 28 also fills the volume of the at least one region 30 with the local increase in depth of the groove 24 underneath the superconducting element 12 and thus holds the superconducting element 12 locally away from the former 22. This results in a local temperature rise and hence a local increase in temperature of the superconducting element 12. The superconducting element 12 may comprise a plurality of superconducting portions 14 and one or more connectors 16, as shown, or may comprise a single superconducting portion. In the case of a plurality of superconducting portions 14, the at least one region 30 with a local increase in the depth of the groove 24 in the former 22 is arranged under the at least one connector 16 and at the same circumferential position as the at least one connector 16 on the former 22 to increase the local temperature. For parallel element systems comprising a number of strands, an additional strand may be added or removed.

A further less desirable possibility is to provide at least two epoxy resins with different thermal characteristics in the groove in the former to hold the superconducting element. A first epoxy resin with a first predetermined thermal conductivity is positioned at one or more circumferential positions in the groove on the former. A second epoxy resin with a second predetermined thermal conductivity is positioned in the remainder of the groove. The first epoxy resin has a lower thermal conductivity than the second epoxy resin. This results in a local temperature rise and hence a local increase in temperature of the superconducting element. The superconducting element may comprise a plurality of superconducting portions and one or more connectors or may comprise a single superconducting portion. In the case of a plurality of superconducting portions, the first epoxy resin with lower thermal conductivity than the second epoxy resin is arranged at the same circumferential position as the at least one connector on the former to increase the local temperature.

The invention claimed is:

1. A superconducting fault current limiter comprising:
   a superconducting element; and
   a means to produce a local increase of a temperature of the superconducting element to provide a local reduction in a critical current and a quench current of the superconducting element, wherein the means to produce the local increase of the temperature of the superconducting element comprises:
      a first epoxy resin with a first predetermined thermal conductivity positioned at one or more positions in a groove on a former; and
      a second epoxy resin with a second predetermined thermal conductivity positioned in a remainder of the groove,
         the first epoxy resin having a lower thermal conductivity than the second epoxy resin, the superconducting element being located in the groove in the former by the first epoxy resin and the second epoxy resin.

2. The superconducting fault current limiter as claimed in claim 1, wherein the superconducting element further comprises a plurality of superconducting portions and at least one connector, each superconducting portion having end regions, each connector being connected to the end regions of adjacent superconducting portions to electrically and thermally connect adjacent superconducting portions of the superconducting fault current limiter together such that each connector provides the local reduction in the critical current and the quench current of the end regions of the superconducting portions in contact with the at least one connector.

3. The superconducting fault current limiter as claimed in claim 2, wherein the at least one connector comprises a metal.

4. The superconducting fault current limiter as claimed in claim 3, wherein the at least one connector comprises copper.

5. The superconducting fault current limiter as claimed in claim 2, wherein the superconducting portions comprise magnesium diboride.

6. The superconducting fault current limiter as claimed in claim 2, wherein the superconducting portions and the at least one connector are arranged around a former.

7. The superconducting fault current limiter as claimed in claim 6, wherein the superconducting portions and the at least one connector are wound in a coil around the former.

8. The superconducting fault current limiter as claimed in claim 2, wherein the at least one connector is not arranged in contact with a cooler.

9. The superconducting fault current limiter as claimed in claim 2, further comprising a plurality of connectors.

10. The superconducting fault current limiter as claimed in claim 2, wherein the first epoxy resin is arranged at the same position as the at least one connector.

11. The superconducting fault current limiter as claimed in claim 1, wherein ends of the superconducting fault current limiter are connected to an electrical circuit by end connectors.

12. The superconducting fault current limiter as claimed in claim 11, wherein the end connectors comprise copper.

13. A superconducting fault current limiter comprising:
    a superconducting element;
    a former the former having a periphery and the periphery her of the former having a groove, and the superconducting element being arranged in the groove in the periphery of the former, and
    a means to produce a local increase of a temperature of the superconducting element to provide a local reduction in a critical current and a quench current of the superconducting element, wherein the means to produce the local increase of the temperature of the superconducting element comprises at least one region with a local increase in a depth of the groove in the former, such that a depth of at least one region of the groove is greater than a depth of another region of the groove in the former, the at least one region being arranged at one or more positions in the groove of the former, the at least one region being arranged at one or more positions in the groove of the former, the superconducting element being located in the groove in the former by an epoxy resin, the former having a greater thermal conductivity than the epoxy resin.

14. The superconducting fault current limiter as claimed in claim 13, wherein the superconducting element further comprises a plurality of superconducting portions and at least one connector, each superconducting portion having end regions, each connector being connected to the end regions of adjacent superconducting portions to electrically and thermally connect adjacent superconducting portions of the superconducting fault current limiter together such that each connector provides the local reduction in the critical current and the quench current of the end regions of the superconducting portions in contact with the at least one connector.

15. The superconducting fault current limiter as claimed in claim 14, wherein the at least one connector comprises a metal.

16. The superconducting fault current limiter as claimed in claim 15, wherein the at least one connector comprises copper.

17. The superconducting fault current limiter as claimed in claim 14, wherein the superconducting portions comprise magnesium diboride.

18. The superconducting fault current limiter as claimed in claim 14, wherein the superconducting portions and the at least one connector are arranged around the former.

19. The superconducting fault current limiter as claimed in claim 18, wherein the superconducting portions and the at least one connector are wound in a coil around the former.

20. The superconducting fault current limiter as claimed in claim 11, wherein the end connectors are arranged in contact with a cooler.

21. The superconducting fault current limiter as claimed in claim 14, wherein the at least one connector is not arranged in contact with a cooler.

22. The superconducting fault current limiter as claimed in claim 14, further comprising a plurality of connectors.

23. The superconducting fault current limiter as claimed in claim 14, wherein the at least one region with the local increase in the depth of the groove in the former is arranged under the at least one connector.

24. The superconducting fault current limiter as claimed in claim 13, wherein ends of the superconducting fault current limiter are connected to an electrical circuit by end connectors.

25. The superconducting fault current limiter as claimed in claim 24, wherein the end connectors comprise copper.

26. The superconducting fault current limiter as claimed in claim 24, wherein the end connectors are arranged in contact with a cooler.

27. A superconducting fault limiter comprising:
a superconducting element; and
a cylindrical former, wherein:
the former has a periphery and the periphery of the former has a groove,
the superconducting element is arranged in the groove in the periphery of the former and the superconducting element is wound in a coil around the former, and
the groove has a depth with respect to the periphery of the former, the groove having at least one region with a local increase in the depth of the groove in the former, a depth of the at least one region of the groove is greater than a depth of another region of the groove in the former, the at least one region is arranged at one or more longitudinally spaced positions in the groove of the former, and
the superconducting element is located in the groove in the former by an epoxy resin, the former has a greater thermal conductivity than the epoxy resin.

* * * * *